(12) United States Patent
Chou et al.

(10) Patent No.: US 9,053,943 B2
(45) Date of Patent: Jun. 9, 2015

(54) BOND PAD DESIGN FOR IMPROVED ROUTING AND REDUCED PACKAGE STRESS

(75) Inventors: Yi-Mang Chou, Zhubei (TW); Yian-Liang Kuo, Toufen Township (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 945 days.

(21) Appl. No.: 13/167,906

(22) Filed: Jun. 24, 2011

(65) Prior Publication Data
US 2012/0326336 A1  Dec. 27, 2012

(51) Int. Cl.
*H01L 23/528* (2006.01)
*H01L 23/00* (2006.01)

(52) U.S. Cl.
CPC .............. *H01L 24/05* (2013.01); *H01L 24/06* (2013.01); *H01L 2224/02373* (2013.01); *H01L 2224/0401* (2013.01); *H01L 2224/05015* (2013.01); *H01L 2224/05022* (2013.01); *H01L 2224/05555* (2013.01); *H01L 2224/05562* (2013.01); *H01L 2224/0613* (2013.01); *H01L 2924/3512* (2013.01); *H01L 2224/05572* (2013.01); *H01L 2224/05012* (2013.01)

(58) Field of Classification Search
CPC . H01L 24/13; H01L 24/16; H01L 2224/0554; H01L 2224/0603; H01L 2224/06051; H01L 2224/1403; H01L 2224/14051; H01L 2224/16; H01L 2224/32014; H01L 2224/49177; H01L 2225/06517
USPC ............................ 257/781, E23.02, 773, 775
See application file for complete search history.

(56) References Cited

U.S. PATENT DOCUMENTS

| | | | |
|---|---|---|---|
| 5,859,474 A * | 1/1999 | Dordi .............................. | 257/737 |
| 6,118,180 A * | 9/2000 | Loo et al. ....................... | 257/737 |
| 6,400,019 B1 * | 6/2002 | Hirashima et al. ............. | 257/737 |
| 2002/0084528 A1 * | 7/2002 | Kim et al. ...................... | 257/773 |
| 2008/0185735 A1 * | 8/2008 | Pham et al. .................... | 257/778 |
| 2008/0217384 A1 * | 9/2008 | Jayantha et al. .......... | 228/180.21 |
| 2009/0020325 A1 * | 1/2009 | Hammedinger et al. ..... | 174/261 |
| 2011/0031618 A1 | 2/2011 | Yu et al. | |

* cited by examiner

*Primary Examiner* — Marc Armand
*Assistant Examiner* — Sarah Salerno
(74) *Attorney, Agent, or Firm* — Lowe Hauptman & Ham, LLP

(57) ABSTRACT

A bond pad design comprises a plurality of bond pads on a semiconductor chip and a plurality of under-bump metallurgy (UBM) layers formed on respective bond pads of the plurality. At least one of the bond pads has an elongated shape having an elongated portion and a contracted portion, the elongated portion oriented substantially along a stress direction radiating from a center to the periphery of the chip.

20 Claims, 3 Drawing Sheets

US 9,053,943 B2

BOND PAD DESIGN FOR IMPROVED ROUTING AND REDUCED PACKAGE STRESS

FIELD

The disclosure relates generally to semiconductor packaging and, more particularly, to a bond pad design for improved routing and reduced package stress.

BACKGROUND

Wafer level chip scale packaging (WLCSP) is currently widely used for its low cost and relatively simple processes. In a typical WLCSP, interconnect structures are formed on metallization layers, followed by the formation of under bump metallurgy (UBM), and the mounting of solder balls. FIG. 1 is a cross-sectional view of an interconnect structure known to the inventors and used in WLCSP. Chip (or wafer) 20 includes substrate 30, on which active circuit 32 is formed. Interconnect structure 40 includes a plurality of metallization layers comprising metal lines and vias (not shown). The metallization layers include a top dielectric layer in which metal pad 52 is formed. Metal pad 52 may be electrically coupled to bond pad 38 through vias 48 and routing line or redistribution layer (RDL) 46. Passivation layers 34 and 36 are formed over substrate 30 and also over interconnect structure 40. Bond pad 38 is formed over passivation layer 34 and UBM layer 41 contacts bond pad 38. Bump ball 42 is formed over and electrically connected to, and possibly contacting, UBM layer 41. Bond pad 38 has a horizontal dimension L1, which is measured in a plane parallel to the front surface (the surface facing up in FIG. 1) of substrate 30. TAW layer 41 has dimension L2, which is measured in the same direction as the direction of horizontal dimension L1. To reduce the adverse effect of warpage and therefore delamination in chip 20, generally dimension L1 of bond pad 38 is larger than dimension L2 of UBM layer 41. A top view of a bond pad design 22 of the structure shown in FIG. 1 is illustrated in FIG. 2.

Because of their size, bond pads 38 occupy a significant percentage of the chip surface. As bond pads 38 have circular shapes and with the increasingly higher density of semiconductor devices, the size of the circular bond pads 38 may limit the number of routing lines or RDLs 46 for routing. If there are too many routing lines per a given area, there is a risk of bridging or causing a short circuit.

By decreasing the size of the circular bond pads 38, a designer can provide more spacing between adjacent bond pads 38 for routing. FIG. 3 shows an example of a bond pad design 22 where dimension L1 of bond pad 38 is smaller than dimension L2 of UBM layer 41. This design allows for an extra routing line to go between adjacent bond pads 38 as compared to the design depicted in FIG. 2. However, chips having such designs are prone to delamination from warpage and/or thermal cycle stress. Stress may be imparted to interconnect structure 40 through bond pad 38, potentially causing the low-k dielectric layers to delaminate in interconnect structure 40. When the size of bond pad 38 is decreased, more stress is imparted to interconnect structure 40 because there is reduced support for UBM layer 41; hence the reliability of the resulting package is made worse. The delamination is particularly severe at the corners 15 of chip 20. To reduce the risk of delamination, typically dimension L1 of bond pad 38 is made larger than dimension L2 of UBM layer 41 by a predetermined amount.

For these reasons and other reasons that will become apparent upon reading the following detailed description, there is a need for an improved bond pad design that provides for additional routing whilst reducing package stress.

BRIEF DESCRIPTION OF DRAWINGS

The features, aspects, and advantages of the disclosure will become more frilly apparent from the following detailed description, appended claims, and accompanying drawings in which:

DETAILED DESCRIPTION

In the following description, numerous specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
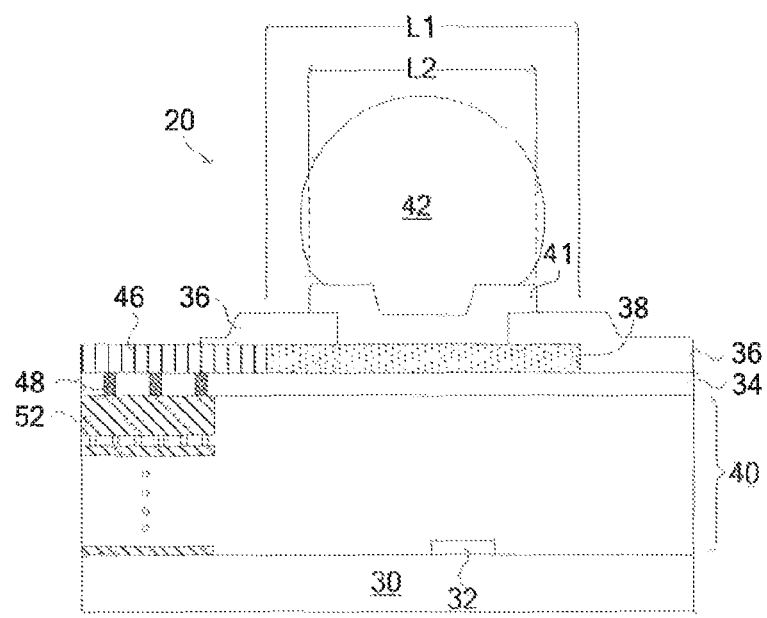
FIG. 1 is a cross-sectional view depicting a chip (or wafer) undergoing a stage in semiconductor fabrication.
Figure 2:
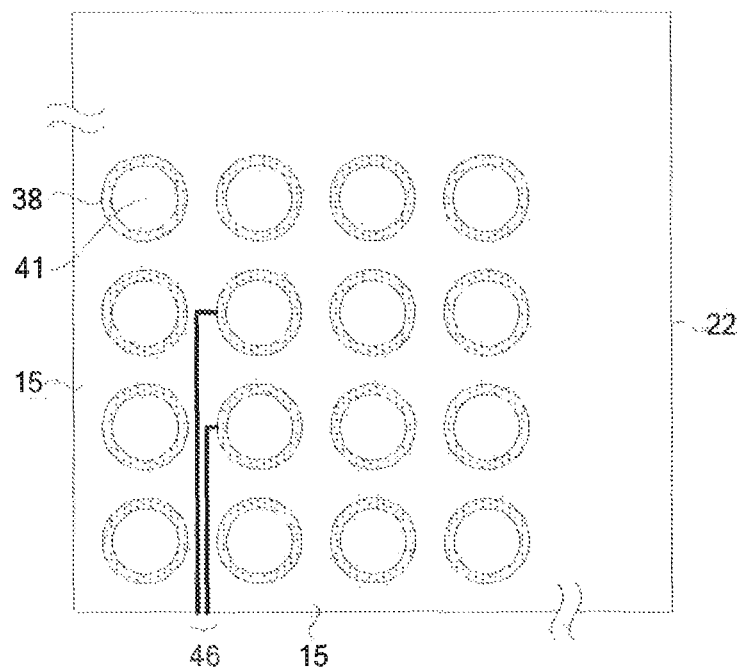
FIG. 2 is a top view of a bond pad design of the chip of FIG. 1, in which the dimension of the bond pad is larger than the dimension of the UBM.
Figure 3:
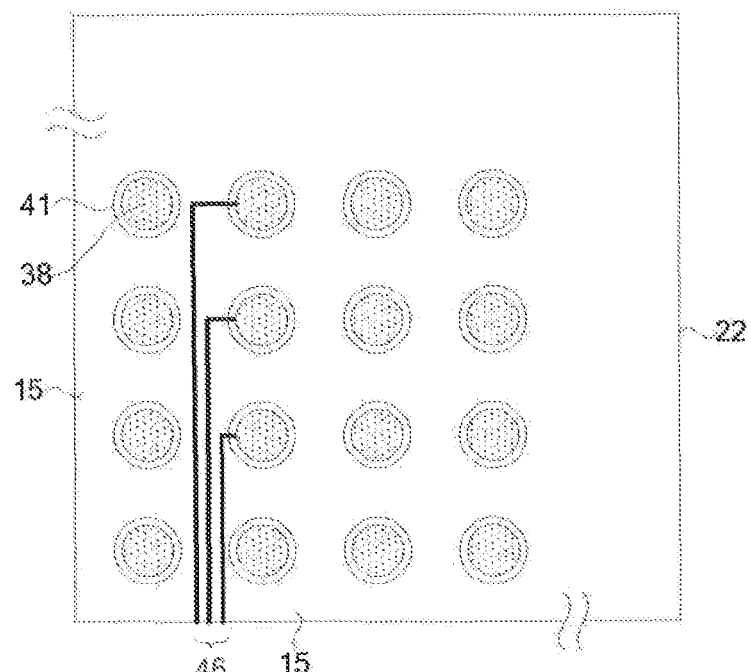
FIG. 3 is a top view of a bond pad design of the chip of FIG. 1, in which the dimension of the bond pad is smaller than the dimension of the UBM.
Figure 4:
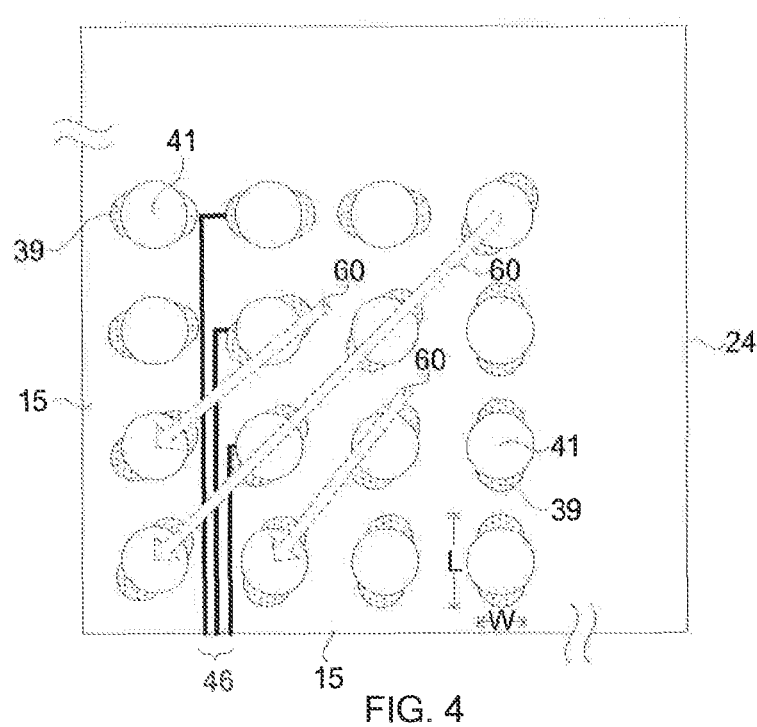
FIG. 4 is a top view of a bond pad design according to one embodiment of the present disclosure.
Figure 5:
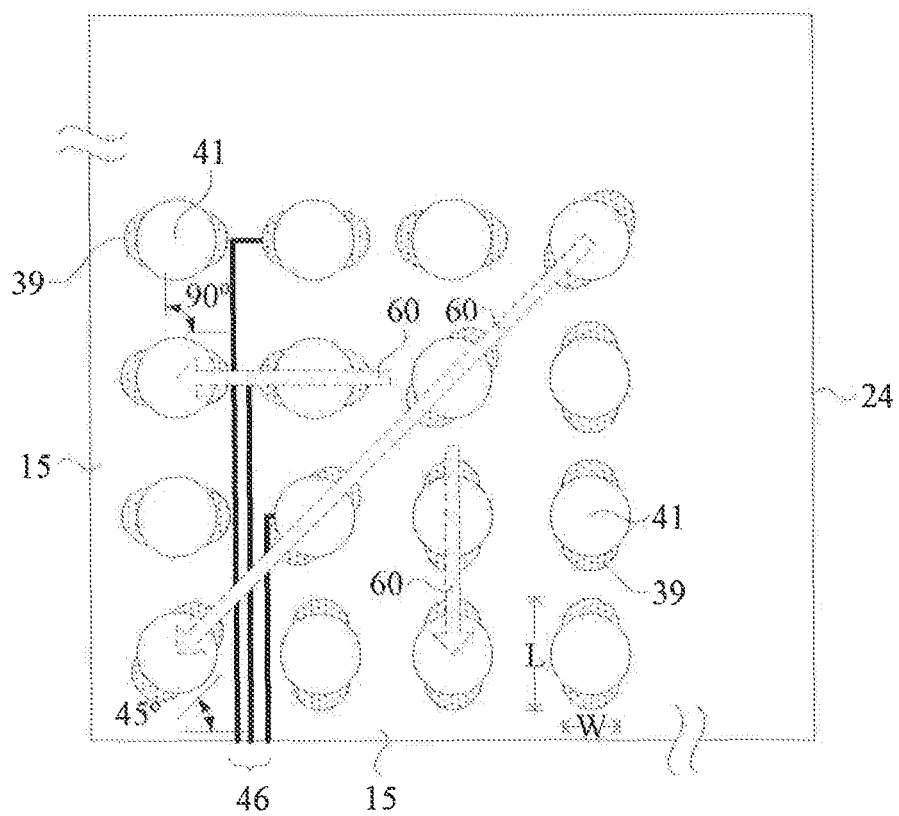
FIG. 5 is a top view of a bond pad design according to another embodiment of the present disclosure.

FIG. 4 is a top view of a bond pad design 24 according to one embodiment of the present disclosure. The bond pad design 24 includes a plurality of bond pads 39 on a semiconductor chip or wafer 20. A plurality of UBM layers 41 are formed on respective ones of the plurality of bond pads 39. It should be noted that FIGS. 4 and 5 illustrate only 16 bond pads with respective UBM layers 41 of a bond pad design that may include hundreds of such bond pads with respective UBM layers. The number of bond pads and UBM layers illustrated herein is limited solely for the purpose of clearly illustrating the inventive aspects of the various embodiments of the present disclosure. The present disclosure is not limited to any specific number of bond pads or UBM layers.

The bond pads 39 have a generally elongated shape with a wide or elongated portion, as measured by length L and a narrow or contracted portion, as measured by width W. According to one embodiment of the present disclosure, a diameter of the UBM layer 41 is greater than the width W of bond pad 39. According to another embodiment, a diameter of the UBM layer 41 is less than the length L of bond pad 39. In other embodiments of the present disclosure, each of the plurality of bond pads 39 has an elongated circular shape. In still other embodiments, each of the plurality of bond pads 39 has an elongated oval shape. It is understood, however that bond pads 39 may have any number of shapes so long as each of the shapes has an elongated portion and a contracted portion.

According to an aspect of the present disclosure, by not being circularly shaped, the narrow or contracted portion of bond pads 39 provides more spacing between adjacent bond pads 39 thereby allowing for more routing lines or RDLs 46 to go between adjacent bond pads 39 in passivation layer 36. This design providing for more routing lines is particularly applicable for use in higher density semiconductor devices.

As the size of the bond pads strongly affects the reliability of the flip chip package, according to another aspect of the present disclosure, the wide or elongated portion provides more support for the overlying UBM layer 41 making the package less prone to delamination due to warpage and/or thermal cycle stress. For example, after chip 20 is bonded to a package substrate (not shown), stresses are generated due to the difference between the coefficient of thermal expansion (CTE) of chip 20 and the CTE of the package substrate. Though bond pad 39 has a narrow portion, by increasing the size of bond pad 39 to provide an elongated portion, less stress is imparted to interconnect structure 40, and hence the reliability of the resulting package is improved.

It has been observed that the delamination problem is particularly acute at the periphery or corners 15 of the chip 20, because the corners 15 suffer more stress than at other places in the chip, such as at the center. For at least this reason, according to another aspect of the present disclosure, bond pads 39 have their elongated portions oriented substantially along stress directions 60 that radiate from a central portion of the chip 20 to the periphery or corners 15 of the chip. By orienting elongated portions substantially along stress directions 60, embodiments of the bond pad design 24 are better able to more effectively address the delamination problem, because the elongated portion provides a much greater linear coverage per unit bond pad while at the same time enhancing the stress distribution characteristics of bond pads 39.

As illustrated in FIG. 5, bond pads 39 are arranged in an array having their elongated portions oriented along stress directions 60 that extend from the center of the chip 20 outwards to the periphery of the chip. According to some embodiments, one or more of the plurality of bond pads 39 have their elongated portions oriented along a stress direction 60 with respect to a corner of chip 20, as denoted by angle 62. According to some embodiments, angle 62 has a substantially 45 degree angle with respect to a corner of the chip 20. According to other embodiments, one or more of the plurality of bond pads 30 have their elongated portions oriented along a stress direction 60 and at a substantially 90 degree angle with respect to a corner 15 of the chip 20, denoted as an angle 64.

According to one embodiment of the present disclosure, a bond pad design comprises a plurality of bond pads on a semiconductor chip; and a plurality of under-bump metallurgy (UBM) layers formed on respective ones of the plurality of bond pads, wherein at least one of the bond pads has an elongated shape having an elongated portion and a contracted portion, the elongated portion oriented substantially along a stress direction radiating from a center of the chip to the periphery thereof.

According to another embodiment of the present disclosure, a bond pad structure comprises one or more bond pads on a semiconductor device; and one or more under-bump metallurgy (FMK) layers formed on respective ones of the one or more bond pads, wherein the bond pads have an elongated oval shape having a narrow portion and a wide portion, the wide portion extending substantially parallel to a direction of stress radiating from the center of the semiconductor device outwards.

According to yet another embodiment of the present disclosure, a bond pad design comprises a plurality of bond pads and a plurality of UBM layers respectively formed on a surface of a chip in a manner that the bond pads have a shape that includes an elongated portion and a contracted portion, and wherein the bond pads are arranged in an array that extends from the center of the chip outwards to the periphery of the chip.

The embodiments of the present disclosure have several advantages. The narrow or contracted portions of the bond pads provide more spacing between adjacent bond pads to allow for more routing lines to go between the pads. Also, by aligning the elongated portion of the bond pad along stress directions, the low-k dielectric layers enjoy greater protection from delamination as less stress is imparted to the interconnect structure, thus improving the reliability of the flip chip package. Furthermore, no additional lithography steps are required other than the requirement to modify one mask.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A bond pad design comprising:
    a plurality of bond pads on a semiconductor chip, all of the bond pads of the plurality of bond pads having an elongated shape, the elongated shape having an elongated portion and a contracted portion, the elongated portion of all of the bond pads of the plurality of bond pads being oriented along a stress direction radiating from a center of the chip to a periphery thereof, the plurality of bond pads comprising:
        a first row of bond pads comprising a first set of bond pads oriented along a first stress direction substantially perpendicular to a first edge of the chip;
        a first column of bond pads comprising a second set of bond pads oriented along a second stress direction substantially perpendicular to a second edge of the chip; and
        a third set of bond pads between the first set of bond pads, the second set of bond pads, the first edge of the chip and the second edge of the chip; and
    a plurality of under-bump metallurgy (UBM) layers on respective bond pads of the plurality of bond pads,
    wherein a ratio of a length of the elongated portion to a width of the contracted portion is constant among the bond pads of the plurality of bond pads, and the first edge of the chip is substantially perpendicular to the second edge of the chip.

2. The bond pad design of claim 1, further comprising one or more routing lines disposed in a space between any two adjacent bond pads.

3. The bond pad design of claim 1, wherein at least one of the plurality of bond pads has an elongated circular shape.

4. The bond pad design of claim 1, wherein at least one of the plurality of bond pads has an elongated oval shape.

5. The bond pad design of claim 1, wherein a diameter of at least one of the plurality of UBM layers is greater than the length of the contracted portion of one of the plurality of bond pads.

6. The bond pad design of claim 1, wherein a diameter of at least one of the plurality of UBM layers is less than the length of the elongated portion of one of the plurality of bond pads.

7. The bond pad design of claim 1, wherein at least one of the plurality of bond pads has an elongated portion oriented at a substantially 45 degree angle with respect to a corner of the chip and at least one bond pad has an elongated portion oriented at a substantially 90 degree angle with respect to an edge of the chip.

8. A bond pad structure comprising:
   bond pads on a semiconductor device, all of the bond pads having an elongated oval shape, the elongated oval shape having a narrow portion and a wide portion, the wide portion of all of the bond pads extending along a direction of stress radiating from the center of the semiconductor device outward, the bond pads comprising:
      a first row of bond pads comprising a first set of bond pads oriented along a first stress direction substantially perpendicular to a first edge of the semiconductor device;
      a first column of bond pads comprising a second set of bond pads oriented along a second stress direction substantially perpendicular to a second edge of the semiconductor device; and
      a third set of bond pads between the first set of bond pads, the second set of bond pads, the first edge of the semiconductor device and the second edge of the semiconductor device; and
   under-bump metallurgy (UBM) layers on respective bond pads,
   wherein a ratio of a length of the wide portion to a width of the narrow portion is constant among the bond pads, and the first edge of the semiconductor device is substantially perpendicular to the second edge of the semiconductor device.

9. The bond pad design of claim 8, further comprising one or more routing lines disposed in a space between any two adjacent bond pads.

10. The bond pad structure of claim 8, wherein a diameter of one of the UBM layers is greater than a length of the narrow portion of one of the bond pads.

11. The bond pad structure of claim 8, wherein a diameter of one of the UBM layers is less than a length of the wide portion of one of the bond pads.

12. The bond pad structure of claim 8, wherein the elongated portion of one of the one or more bond pads is positioned at about 45 degrees with reference to a corner of the semiconductor device.

13. The bond pad structure of claim 8, wherein the elongated portion of one of the one or more bond pads is positioned at about 90 degrees in relation to a side of the semiconductor device.

14. A bond pad design comprising:
   a plurality of bond pads on a surface of a chip, all of the bond pads of the plurality of bond pads have a shape that includes an elongated portion and a contracted portion, the elongated portion of all of the bond pads of the plurality of bond pads is oriented along a line radiating from a center of the chip to a periphery thereof, the plurality of bond pads comprising:
      a first row of bond pads comprising a first set of bond pads oriented along a first stress direction substantially perpendicular to a first edge of the chip;
      a first column of bond pads comprising a second set of bond pads oriented along a second stress direction substantially perpendicular to a second edge of the chip; and
      a third set of bond pads between the first set of bond pads, the second set of bond pads, the first edge of the chip and the second edge of the chip; and
   a plurality of UBM layers on respective bond pads of the plurality of bond pads,
   wherein the first edge of the chip is substantially perpendicular to the second edge of the chip, and a ratio of a length of the elongated portion to a width of the contracted portion is constant among the bond pads of the plurality of bond pads.

15. The bond pad design of claim 14, further comprising one or more routing lines disposed in a space between any two adjacent bond pads.

16. The bond pad design of claim 14, wherein the bond pads are arranged along stress directions in the chip.

17. The bond pads of claim 14, wherein the bond pads have an oval shape.

18. The bond pads of claim 17, wherein the bond pads have an elongated oval shape.

19. The bond pad design of claim 14, wherein a diameter of one of the UBM layers is greater than the contracted portion of one of the bond pads.

20. The bond pad design of claim 14, wherein a diameter of one of the UBM layers is less than the elongated portion of one of the bond pads.

* * * * *